(12) United States Patent
Hsu et al.

(10) Patent No.: US 7,759,671 B2
(45) Date of Patent: *Jul. 20, 2010

(54) LIGHT EMITTING DEVICE PACKAGE

(75) Inventors: Chih-Hao Hsu, Hsinchu (TW); Rong Xuan, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/168,073

(22) Filed: Jul. 4, 2008

(65) Prior Publication Data

US 2009/0179218 A1    Jul. 16, 2009

Related U.S. Application Data

(60) Provisional application No. 61/020,397, filed on Jan. 11, 2008.

(51) Int. Cl.
*H01L 33/00*    (2010.01)
(52) U.S. Cl. .................... 257/13; 257/99; 257/E33.001
(58) Field of Classification Search ............... 257/79, 257/98, 13, 99; 438/29, 570, 694
See application file for complete search history.

(56) References Cited

U.S. PATENT DOCUMENTS

| 4,450,460 | A |   | 5/1984 | Morimoto |
| 5,874,749 | A | * | 2/1999 | Jonker ......................... 257/98 |
| 7,208,775 | B2 | * | 4/2007 | Osipov et al. ............... 257/103 |

OTHER PUBLICATIONS

Jonker, "Progress Toward Electrical Injection of Spin-Polarized Electrons Into Semiconductors", 2003, Proc. IEEE, vol. 91, No. 5, pp. 727-740.*
Article titled "Two-Dimensional Quantum-Mechanical Confinement of Electrons in LED by Strong Magnetic Fields" authored by Arakawa et al., IEEE Transactions on Electron Devices, vol. ED-30, No. 4, Apr. 1983, pp. 330-334.

* cited by examiner

*Primary Examiner*—Thomas L Dickey
*Assistant Examiner*—Nikolay Yushin
(74) *Attorney, Agent, or Firm*—Jianq Chyun IP Office

(57) ABSTRACT

A light emitting device package including an light emitting device and at least one magnetic source is provided. The light emitting device includes a first doped type layer, a second doped type layer, and a light emitting layer. The light emitting layer is located between the first doped type layer and the second doped type layer. The magnetic source is disposed beside the light emitting device for applying a magnetic field to the light emitting device.

28 Claims, 14 Drawing Sheets

LIGHT EMITTING DEVICE PACKAGE

CROSS-REFERENCE TO RELATED APPLICATION

This application claims the priority benefit of U.S. provisional application Ser. No. 61/020,397, filed on Jan. 11, 2008, all disclosures are incorporated therewith.

BACKGROUND OF THE INVENTION

1. Field of the Invention

The present invention generally relates to a light source and, in particular, to a light emitting device.

2. Description of Related Art

Distinct from regular fluorescent lamps or incandescent lamps that generate heat to emit light, semiconductor light emitting devices such as light emitting diodes (LEDs) adopt the specific property of semiconductor to emit light, in which the light emitted by the semiconductor light emitting devices is referred to as cold luminescence. The light emitting devices have advantages of long lifetime, light weight, high brightness, and low power consumption, such that the light emitting devices have been employed in a wide variety of applications, such as optical displays, traffic lights, data storage apparatus, communication devices, illumination apparatus, medical treatment equipments, and 3C products. Accordingly, how to improve the light emitting efficiency of light emitting devices is an important issue in this art.

FIG. 1 is a schematic cross-sectional view of a conventional LED. Referring to FIG. 1, the LED 100 is a vertical type LED, which includes electrodes 110 and 120, and a light emitting layer 130. As shown in FIG. 1, the tight lines represent high current density, and the area with most number of lines is located between the electrodes 110 and 120. However, due to the congenital deficiency, the area with highest light emitting efficiency is blocked by the electrode 110, such that the overall light emitting efficiency of the LED 100 is adversely affected.

FIG. 2 is a schematic top view of another conventional LED. Referring to FIG. 2, the LED 200 is a horizontal type LED, which includes electrodes 210 and 220. Because the current always transmits through a path with lowest resistance, the distribution of the current density is inhomogeneous between the electrodes 210 and 220, where the main distribution of the current density is along the direct path between the electrodes 210 and 220. Therefore, in order to increase the amount of light emitted by the LED 200, the uniform current distribution area is needed to be enlarged, such that the size of the LED 200 is enlarged.

Based on aforesaid description, it is concluded that the light emitting efficiency of the LED may be influenced by the following factors.

1. The area between the electrodes of the LED is not only the area with highest current carrier density, but also the area producing most photons. However, the photons produced between the electrodes are mostly blocked by the opaque electrode, such that the light emitting efficiency is hard to be enhanced.

2. A current always transmits through a path with lowest resistance, which results in inhomogeneous luminance of the LED, such that the light emitting efficiency and the size of the LED are also limited.

SUMMARY OF THE INVENTION

According to an embodiment of the present invention, a light emitting device package including a light emitting device and at least one magnetic source is provided. The light emitting device includes a first doped type layer, a second doped type layer, and a light emitting layer. The light emitting layer is located between the first doped type layer and the second doped type layer. The magnetic source is disposed beside the light emitting device for applying a magnetic field to the light emitting device.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
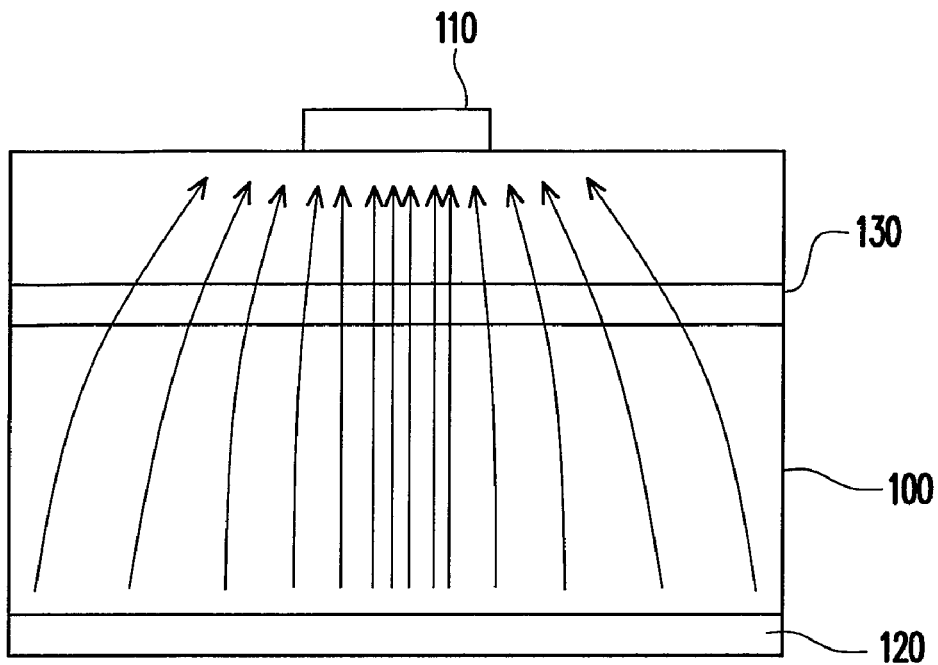
FIG. 1 is a schematic cross-sectional view of a conventional vertical type light emitting diode (LED).
Figure 2:
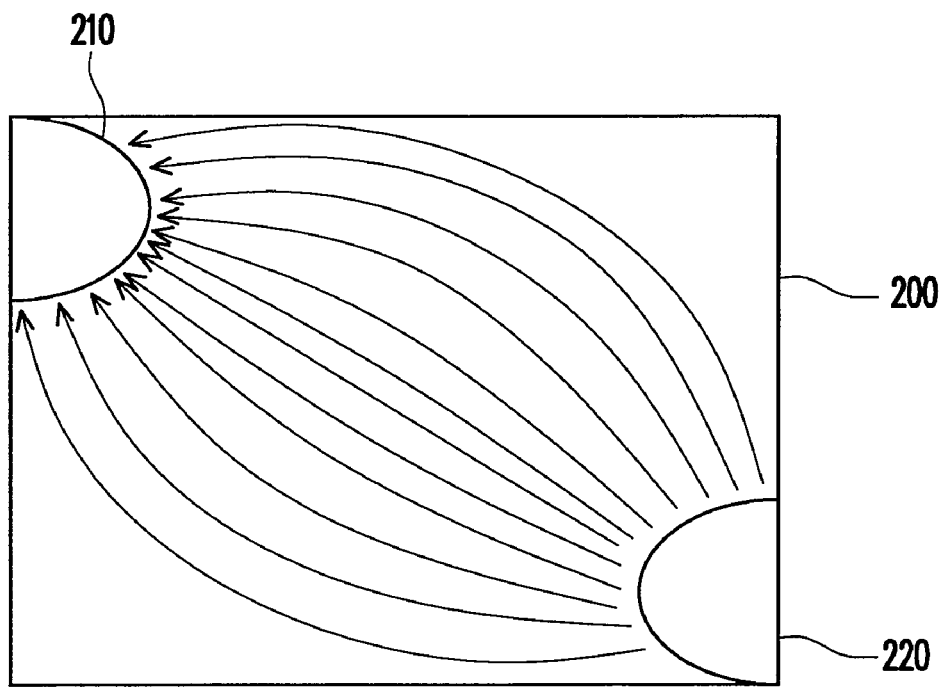
FIG. 2 is a schematic top view of a conventional horizontal type LED.

Reference will now be made in detail to the present embodiments of the invention, examples of which are illustrated in the accompanying drawings. Wherever possible, the same reference numbers are used in the drawings and the description to refer to the same or like parts.

In the present specification, the material of the semiconductor layers includes III-V group compound semiconductor and/or II-VI group compound semiconductor. In addition, a reflector in the present specification is defined as that when a light beam is perpendicularly incident on the reflector, the reflector reflects 30% or more of the light beam.

First Embodiment

Figure 3:
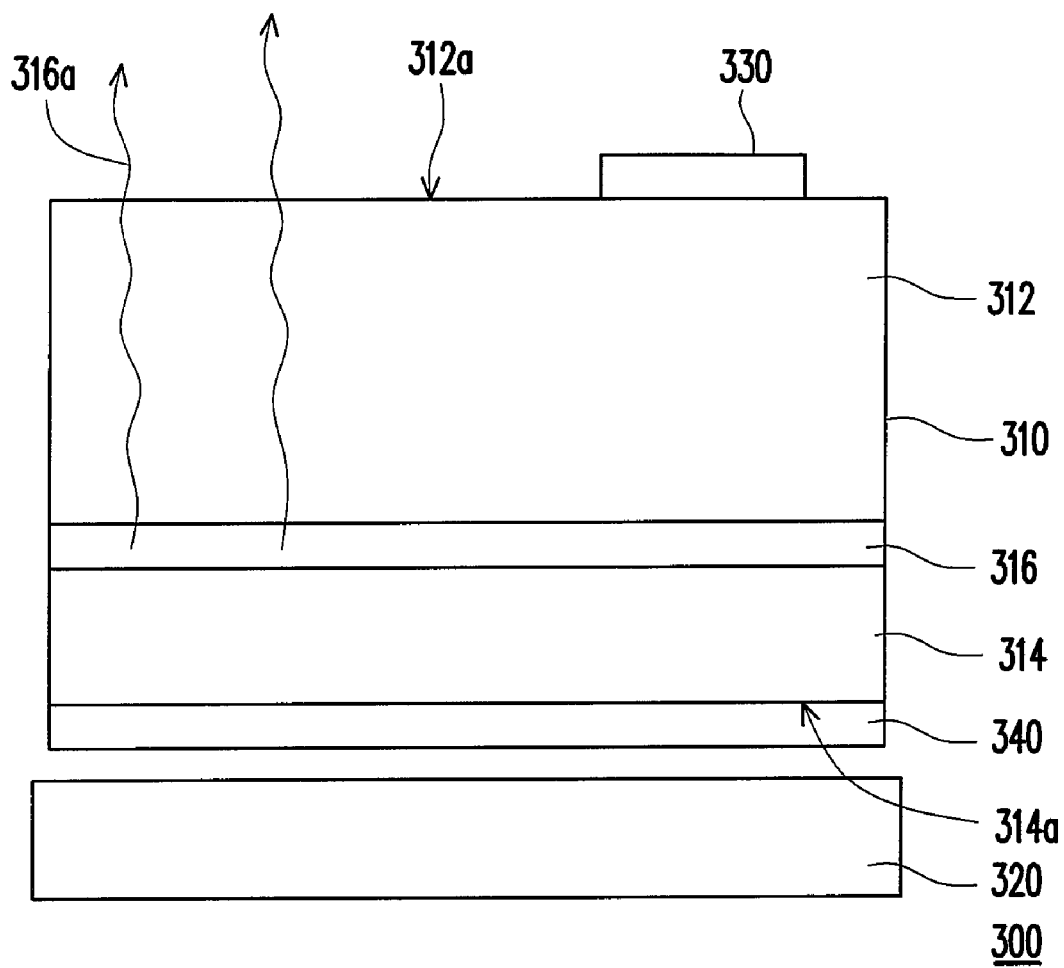
FIG. 3 is a schematic cross-sectional view of a light emitting device package according to a first embodiment of the present invention.

FIG. 3 is a schematic cross-sectional view of a light emitting device package according to a first embodiment of the present invention. Referring to FIG. 3, the light emitting device package 300 of the present embodiment includes a light emitting device 310 and a magnetic source 320 is provided. The light emitting device 310 includes a first doped type layer 312, a second doped type layer 314, and a light emitting layer 316. The light emitting layer 316 is located between the first doped type layer 312 and the second doped type layer 314. In the present embodiment, the first doped type layer 312 is an n-type semiconductor layer, and the second doped type layer 314 is a p-type semiconductor layer. In other words, the light emitting device 310 is a light emitting diode (LED). However, in other embodiments, the light emitting device 310 may also be a laser diode. Alternatively, in still other embodiments, the first doped type layer 312 and the second doped type layer 314 may be organic layers, and the light emitting device 310 may be an organic light emitting diode (OLED).

In the present embodiment, the light emitting layer 316 is a p-n junction between the first doped type layer 312 and the second doped type layer 314. However, in other embodiments (not shown), the light emitting layer 316 may be a quantum well layer between the first doped type layer 312 and the second doped type layer 314 or other appropriate active layers. The magnetic source 320 is disposed beside the light emitting device 310 for applying a magnetic field to the light emitting device 310. In more detail, the magnetic source 320 may directly contact, be indirectly connected to, or not contact the light emitting device 310. The magnetic source 320 is, for example, an element with magnetism, an electrically conducting coil, an electromagnet, or other elements capable of generating the magnetic field.

In the present embodiment, the light emitting device package 300 further includes a first electrode 330 and a second electrode 340. The first electrode 330 is disposed on a first surface 312a of the first doped type layer 312. The second electrode 340 is disposed on a second surface 314a of the second doped type layer 314. In the present embodiment, the first surface 312a and the second surface 314a face away from each other; that is to say, the light emitting device package 300 is a vertical type light emitting device package. It should be noted that the first doped type layer 312 and the second doped type layer 314 may be exchanged by each other in other embodiments.

When a voltage is applied to the first electrode 330 and the second electrode 340, currents are generated which pass through the second doped type layer 314, the light emitting layer 316, and the first doped type layer 312. The interaction between the currents and the magnetic filed of the magnetic source 320 generates a Lorentz force on the currents, so as to push the currents along a direction away from the region under the first electrode 330, such as the left in FIG. 3. In this way, the currents are not concentrated under the first electrode 330 but spread along the direction away from the region under the first electrode 330, such that more proportion of photons 316a generated in the light emitting layer 316 are not blocked by the second electrode 340 and exit the light emitting device 310 through the first surface 312a, thus increasing the light emitting efficiency of the light emitting device package 300.

It should be noted that the number of the magnetic source 320 in the present invention is not limited to one. In other embodiment, the number of the magnetic sources may be more than one.

Second Embodiment

Figure 4A:
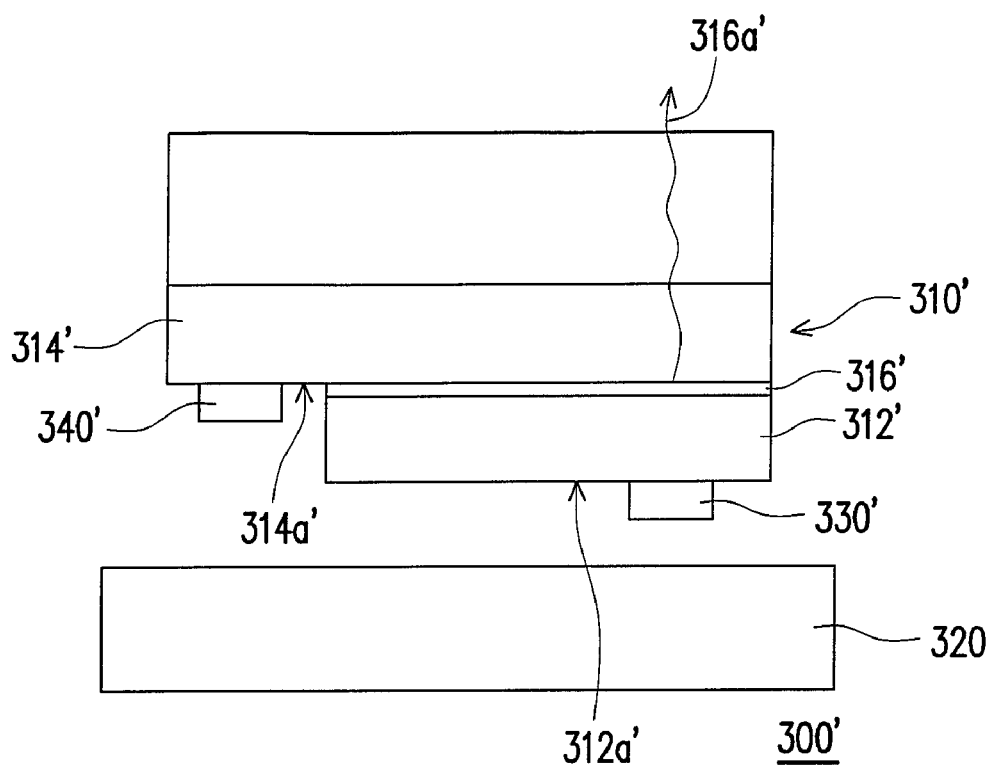
FIG. 4A is a schematic cross-sectional view of a light emitting device package according to a second embodiment of the present invention.
Figure 4B:
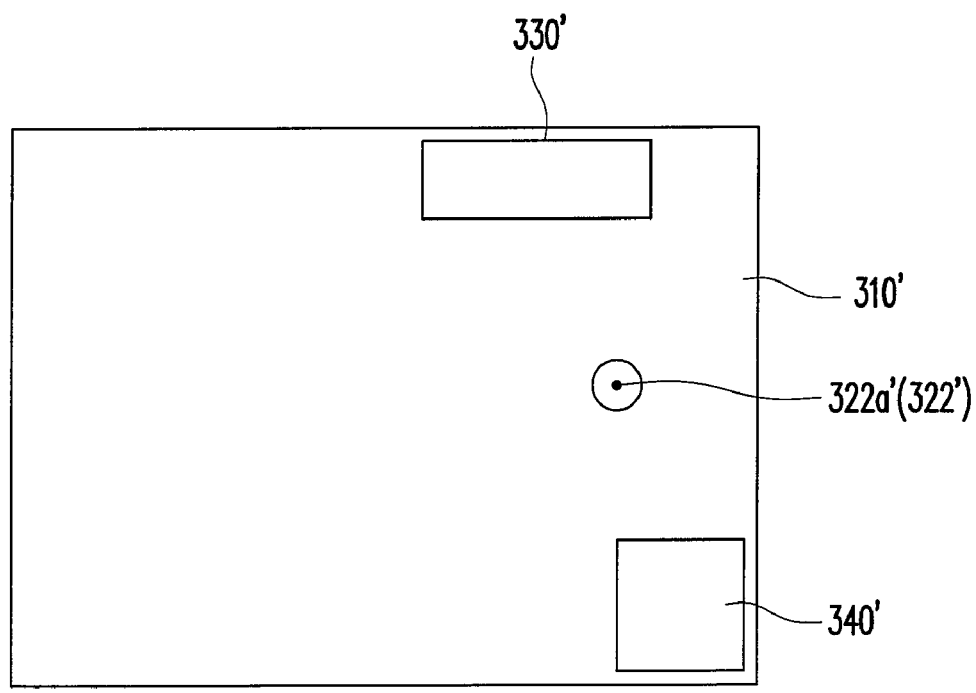
FIG. 4B is a schematic bottom view of a light emitting device in FIG. 4A.

FIG. 4A is a schematic cross-sectional view of a light emitting device package according to a second embodiment of the present invention, and FIG. 4B is a schematic bottom view of a light emitting device in FIG. 4A. Referring to FIGS. 4A and 4B, the light emitting device package 300' is similar to the light emitting device package 300 in FIG. 3, but the differences therebetween are as follows. In the light emitting device package 300', a first electrode 330' is disposed on a first surface 312a' of a first doped type layer 312' of an light emitting device 310', and a second electrode 340' is disposed on a second surface 314a' of a second doped type layer 314'. The first surface 312a' and the second surface 314a' face along substantially the same direction; that is to say, the light emitting device package 300' is a horizontal type light emitting device package. It should be noted that the first doped type layer 312' and the second doped type layer 314' may be exchanged by each other in other embodiments.

In the light emitting device package 300' of the present embodiment, the interaction between the currents in the light emitting device 310' and the magnetic filed of the magnetic source 320 generates a Lorentz force pushing the currents out of the direct paths between the first electrode 330' and the second electrode 340', such that the currents are more uniform, which makes photons 316a' emitted from a light emitting layer 316' more uniform. In this way, the surface area of the light emitting device 310' be relatively small even if a larger area for emitting uniform light is needed.

In the present embodiment, the photons 316a' pass through the second doped type layer 314' and are then transmitted to the outside away from the first surface 312a'; that is to say, the light emitting device package 300' may be a flip chip package. However, in other embodiments, the photons 316a' may pass through the first doped type layer 312' and the first surface 312a' and are then transmitted to the outside; that is to say, the light emitting device package 300' may be a wire bonded chip package.

Figure 5:
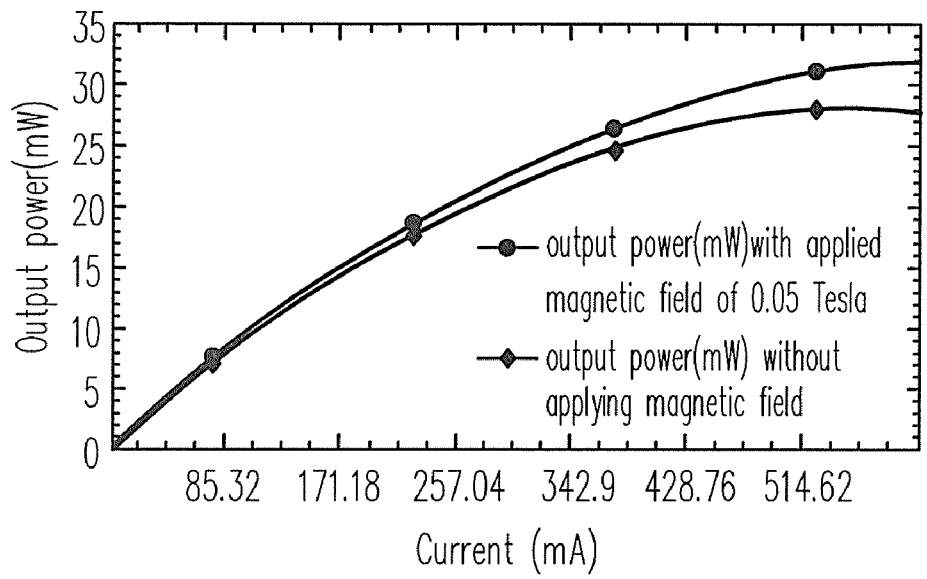
FIG. 5 is a graph showing the additional output power of the light emitted by a light emitting device package applying a magnetic field according to one embodiment of the present invention.

FIG. 5 is a graph showing the additional output power of the light emitted by a light emitting device package applying a magnetic field according to one embodiment of the present invention, where x axis coordinate refers to the current injected to the light emitting device and y axis coordinate refers to the output power of light emitted by the light emitting device. Referring to FIG. 5, with applying a 0.05 T magnetic field to the light emitting device, when the amount of injected current is increased, the obtained additional output power of light is also increased,(referring to the curve in FIG. 5 indicated by "output power (mW) with applied magnetic field 0.05 Tesla). where an additional 15 percent output power of light is obtained when injecting a 600 mA current to the light emitting device when the curve indicated by "output power (mW) with applied Magnetic field of 0.05 Tesla" is compared with the curve indicated by "output power (mW) without applying magnetic field". Specifically. The curve indicated by "output Power (mW) without applying magnetic field is when no magnetic field is applied to the light emitting device.

Figure 6:
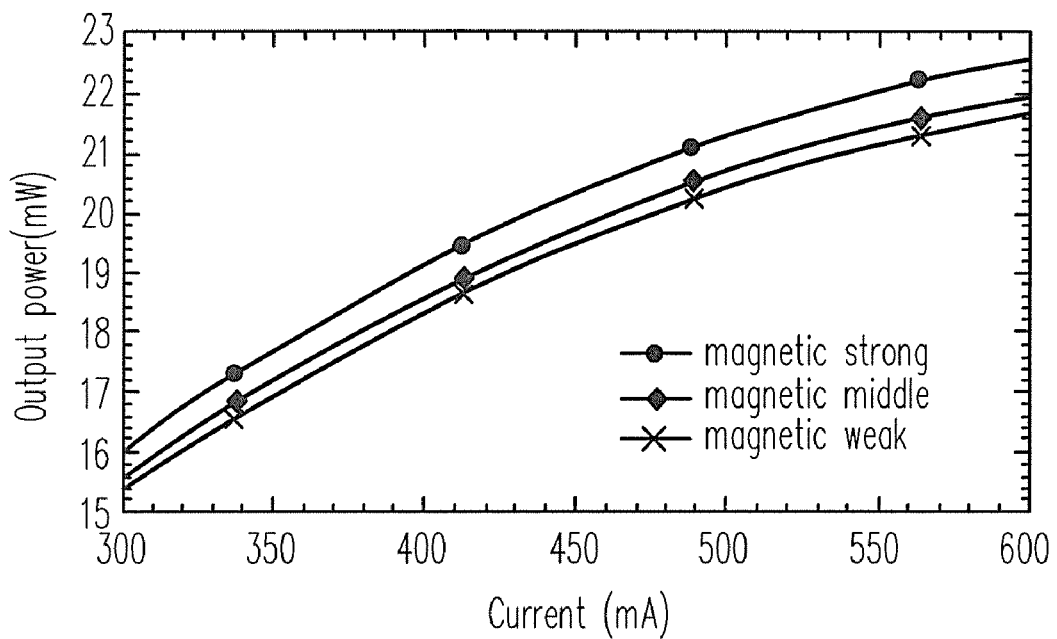
FIG. 6 is a graph showing the output power of the light emitted by a light emitting device applying a magnetic field according to one embodiment of the present invention.

FIG. 6 is a graph showing the output power of the light emitted by a light emitting device applying a magnetic field according to one embodiment of the present invention, where x axis coordinate refers to the current injected to the light emitting device and y axis coordinate refers to the output power of light emitted by the light emitting device. Referring to FIG. 6, when the strength of the external magnetic field is increased, the obtained additional output power of light is also increased.

It should be noted herein that the strength of the external magnetic field applied to the light emitting package of the present invention may be a constant value, a time-varying value, or a gradient-varying value, but is not limited to them. In addition, the angle between the direction of the magnetic field and the light emitting direction is from 0 to 360.

Third Embodiment

Figure 7:
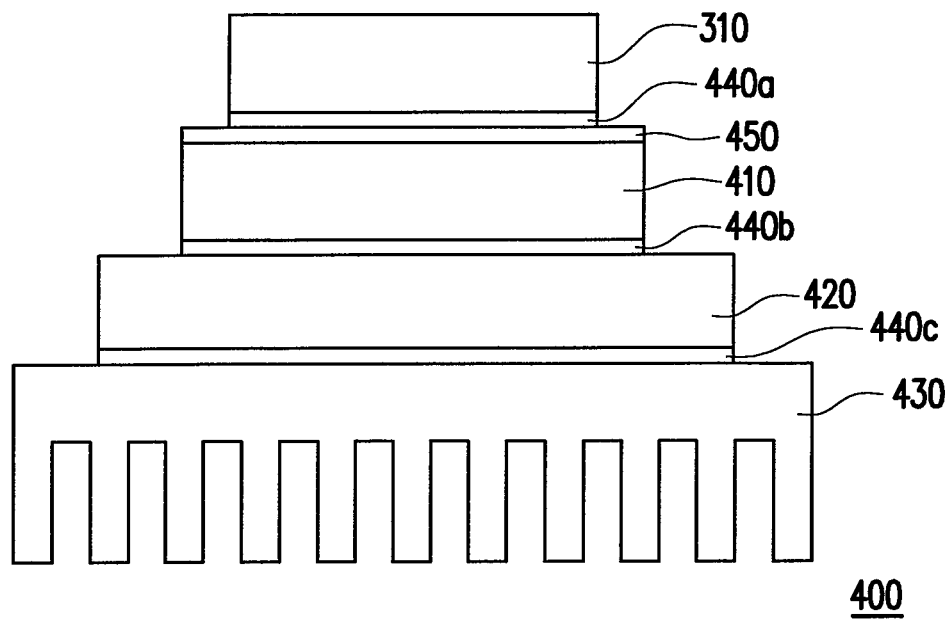
FIG. 7 is a schematic cross-sectional view of a light emitting device package according to a third embodiment of the present invention.

FIG. 7 is a schematic cross-sectional view of a light emitting device package according to a third embodiment of the present invention. Referring to FIG. 7, the light emitting device package 400 of the present embodiment is similar to the above light emitting device package 300 in FIG. 3, but the differences between them are as follows. The light emitting device package 400 of the present embodiment further includes a first carrier 410, a second carrier 420, and a heat sink 430. The first carrier 410 is disposed on the second carrier 420, and the second carrier 420 is disposed on the heat sink 430. The first carrier 410 is, for example, a submount, and the second carrier 420 is, for example, a slug. In the present embodiment, at least one of the first carrier 410, the second carrier 420, and the heat sink 430 has magnetism to from the magnetic source 320 shown in FIG. 3. In the present embodiment, the heat sink 430 has a plurality of fins. However, in other embodiment, the heat sink 430 may not have fins and be a block or otherwise shaped heat sink. Additionally, the shape of the fins of the heat sink 430 is not limited in the present invention. Moreover, the heat sink 430 may have heat conductivity and optionally have electrical conductivity.

In the present embodiment, a connection layer 440a is disposed between the light emitting device 310 and the first carrier 410 for bonding the light emitting device 310 and the first carrier 410. In addition, a reflector 450 is disposed between the light emitting device 310 and the first carrier 410 for reflecting light from the light emitting device 310, so as to increase the light emitting efficiency of the light emitting device package 400. However, in other embodiments, the reflector 450 may also be disposed between the first carrier 410 and the second carrier 420. Additionally, in other embodiments, the light emitting device 310 may be bonded directly on the first carrier 410 without being bonded through the connection layer 440a. In the present embodiment a connection layer 440b is disposed between the first carrier 410 and the second carrier 420 for bonding the first carrier 410 and the second carrier 420. However, in other embodiments, the first carrier 410 may be bonded directly on the second carrier 420 without being bonded through the connection layer 440b. In the present embodiment, a connection layer 440c is disposed between the second carrier 420 and the heat sink 430 for bonding the second carrier 420 and the heat sink 430. However, in other embodiments, the second carrier 420 may be bonded directly on or screwed on the heat sink 430 without being bonded through the connection layer 440c. Furthermore, in the present embodiment, the connection layers 440a, 440b, and 440c is, for example, electrically conducting glue, insulating glue, heat dissipating glue, metal glue, non-metal glue, metal bump, or other appropriate material.

It should be noted that the light emitting device package in the present invention is not limited to include the second carrier 420 and the heat sink 430. In other embodiments, the light emitting device package may not include the heat sink 430, and at least one of the first carrier 410 and the second carrier 420 has magnetism to form the magnetic source. Alternatively, the light emitting device package may not include the second carrier 420 and the heat sink 430, and the first carrier 410 has magnetism and is, for example, a submount or a slug.

Fourth Embodiment

Figure 8:
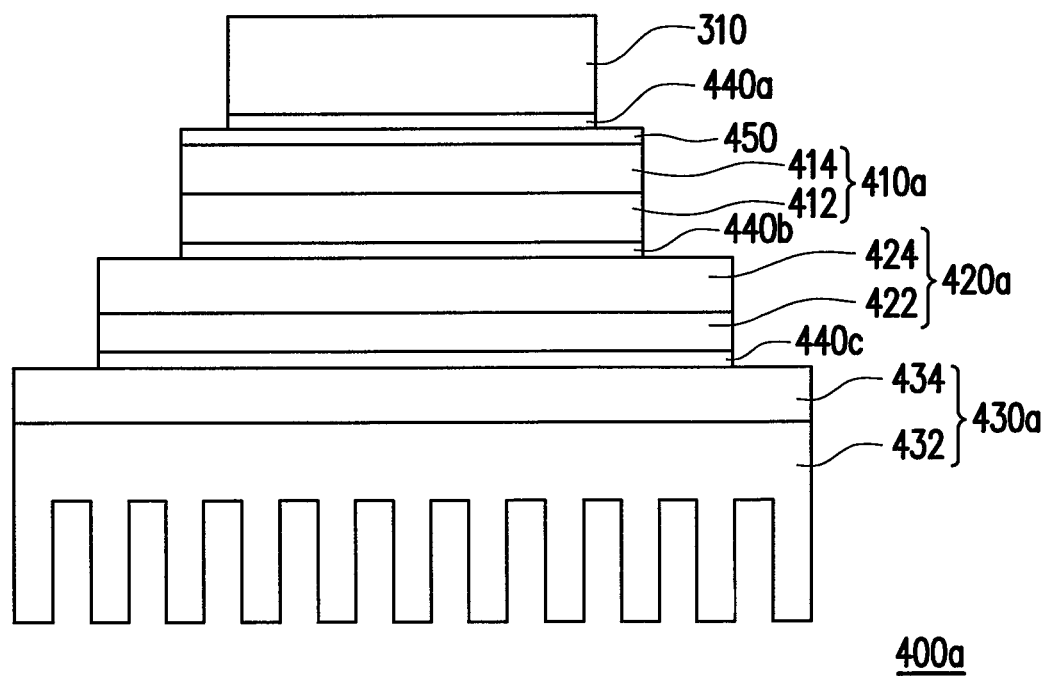
FIG. 8 is a schematic cross-sectional view of the light emitting device package according to a fourth embodiment of the present embodiment.

FIG. 8 is a schematic cross-sectional view of a light emitting device package according to a fourth embodiment of the present embodiment. Referring to FIG. 8, the light emitting device package 400a of the present embodiment is similar to the above light emitting device package 400 in FIG. 7, but the differences between them are as follows. It is not limited in the present invention that the at least one of the first carrier 410, the second carrier 420, and the heat sink 430 wholly has magnetism. Alternatively, there may be a portion of the at least one of the first carrier 410, the second carrier 420, and the heat sink 430 having magnetism to form the magnetic source.

For example, in the light emitting device package 400a of the present embodiment, a first carrier 410a includes a first portion 412 and a second portion 414 located on the first portion 412, a second carrier 420a includes a third portion 422 and a fourth portion 424 located on the third portion 422, and a heat sink 430a includes a fifth portion 432 and a sixth portion 434 located on the fifth portion 432. One of the first portion 412 and the second portion 414 is a magnetic portion, and the other is a non-magnetic portion. Additionally, one of the third portion 422 and the fourth portion 424 is a magnetic portion, and the other is a non-magnetic portion. Moreover, one of the fifth portion 432 and sixth portion 434 is a magnetic portion, and the other is a non-magnetic portion.

In other embodiments, there may be two of the first carrier, the second carrier, and the heat sink each have a magnetic portion and a non-magnetic portion, while the other has a single portion with or without magnetism. Alternatively, there may be one of the first carrier, the second carrier, and the heat sink has a magnetic portion and a non-magnetic portion, and the others each have a single portion with or without magnetism.

Fifth Embodiment

Figure 9:
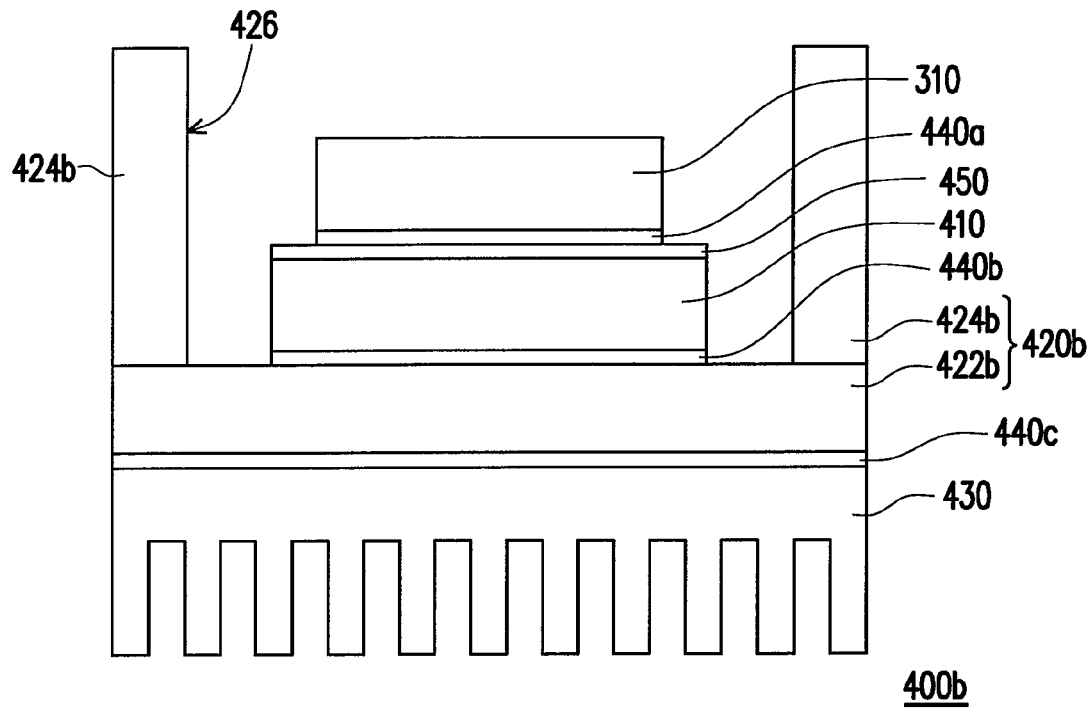
FIG. 9 is a schematic cross-sectional view of a light emitting device package according to a fifth embodiment of the present embodiment.

FIG. 9 is a schematic cross-sectional view of a light emitting device package according to a fifth embodiment of the present embodiment. Referring to FIG. 9, the light emitting device package 400b of the present embodiment is similar to the above light emitting device package 400 in FIG. 7, but the differences between them are as follows. In the light emitting device package 400b, a second carrier 420b has a recess 426, and the light emitting device 310 and the first carrier 410 is located in the recess 426. In the present embodiment, the second carrier 420b is, for example, a slug, and includes a bottom portion 422b and a side wall portion 424b. The side wall portion 424b is disposed on the bottom portion 422b and surrounds the light emitting device 310 and the first carrier 410. In the present embodiment, both the side wall portion 424b and the first carrier 410 have magnetism to form two magnetic sources, thus increasing the strength of the magnetic field applied to the light emitting device 310, such that the light emitting efficiency of the light emitting device package 400b is further improved. It should be noted that the shape of the recess 426 is not limited to that shown in FIG. 9 in the present invention, and may be otherwise shaped in other embodiments.

However, in other embodiment, the bottom portion 422b may have magnetism, and the side wall portion 424b may not have magnetism. Alternatively, the second carrier 420b may have only one portion with or without magnetism. That is to say, the bottom portion 422b and the side wall portion 424b may be integrally formed. Additionally, the first carrier 410 may not have magnetism.

Sixth Embodiment

Figure 10:
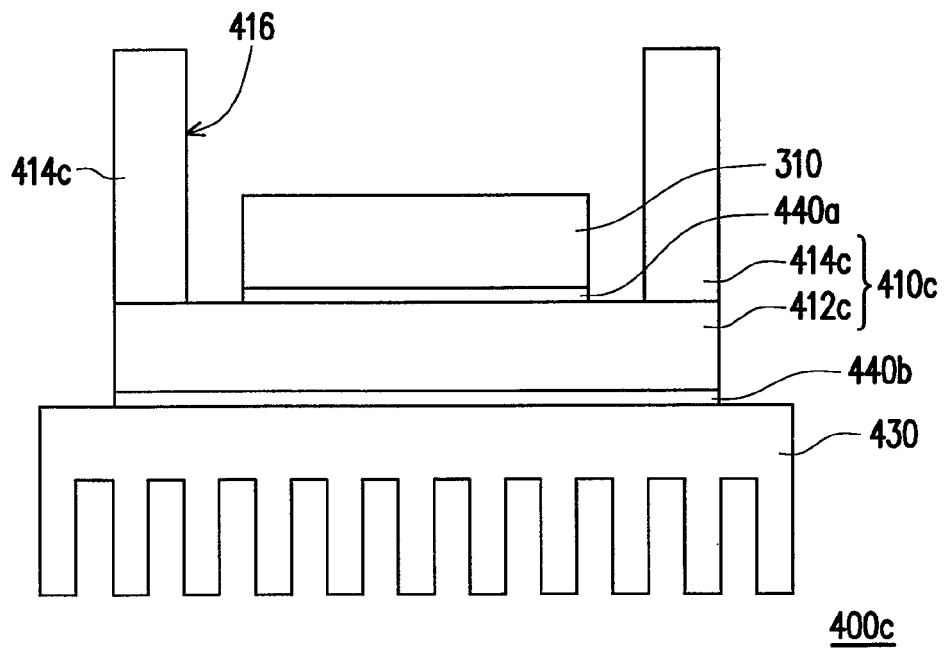
FIG. 10 is a schematic cross-sectional view of a light emitting device package according to a sixth embodiment of the present invention.

FIG. 10 is a schematic cross-sectional view of a light emitting device package according to a sixth embodiment of the present invention. Referring to FIG. 10, the light emitting device package 400c of the present embodiment is similar to the above light emitting device package 400b in FIG. 9, but the differences between them are as follows. The light emitting device package 400c of the present embodiment does not have the second carrier 420b shown in FIG. 9. In addition, a first carrier 410c has a recess 416, and the light emitting device 310 is located in the recess 416. Moreover, the first carrier 410c may be a submount or a slug, and have a bottom portion 412c and a side wall portion 414c. The side wall portion 414c is disposed on the bottom portion 412c, and surrounds the light emitting device 310. In the present embodiment, the bottom portion 412c or the side wall portion 414c has magnetism. However, in other embodiments, the first carrier 410c may have only one portion with or without magnetism. In the present embodiment, the connection layer 440b is disposed between the first carrier 410c and the heat sink 430 for bonding the first carrier 410c and the heat sink 430.

Seventh Embodiment

Figure 11:
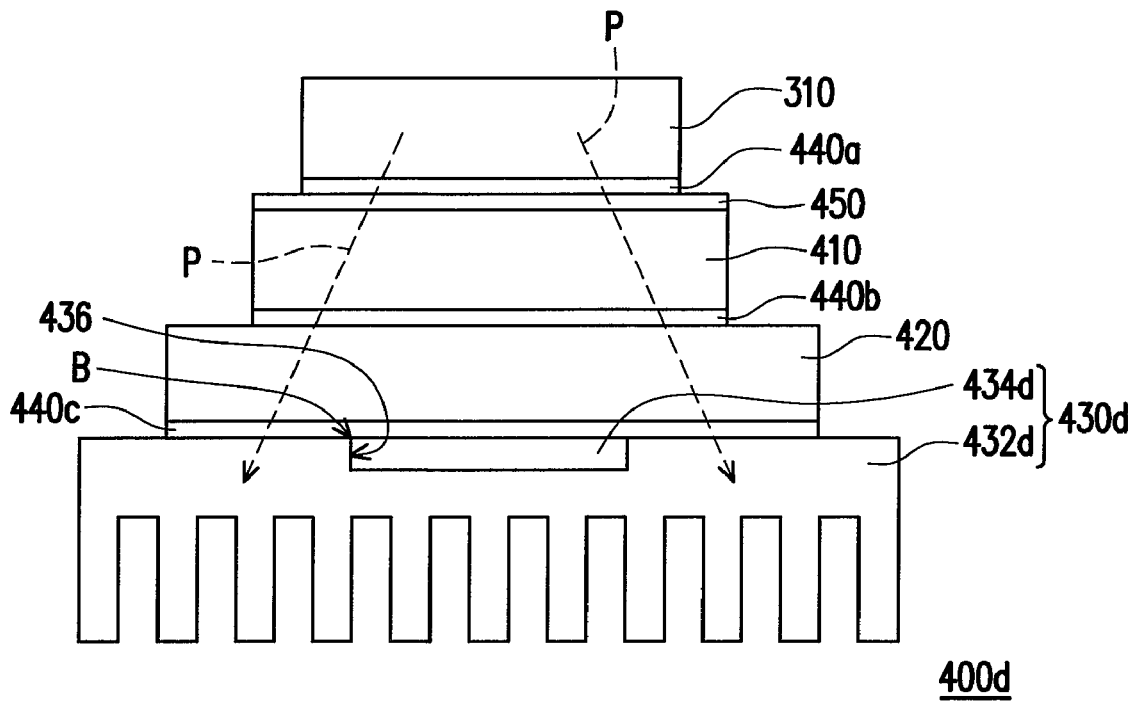
FIG. 11 is a schematic cross-sectional view of a light emitting device package according to a seventh embodiment of the present invention.

FIG. 11 is a schematic cross-sectional view of a light emitting device package according to a seventh embodiment of the present invention. Referring to FIG. 11, the light emitting device package 400d of the present embodiment is similar to the above light emitting device package 400 in FIG. 7, but the differences are as follows. In the light emitting device package 400d, a heat sink 430d includes a fifth portion 432d and a sixth portion 434d. The fifth portion 432d has a recess 436 for containing the sixth portion 434d. The second carrier 420 is disposed on both the magnetic fifth portion 432d and the sixth portion 434d and crosses a boundary B between the fifth portion 432d and the sixth portion 434d. In the present embodiment, the fifth portion 432d is a non-magnetic portion, and the sixth portion 434d is a magnetic portion. The heat conductivity of the non-magnetic portion is greater than the heat conductivity of the magnetic portion, such that a heat conduction path P is formed from the light emitting device 310 to the fifth portion 432d through the first carrier 410 and the second carrier 420. Since the heat conduction path P does not passes through any magnetic material, such that the heat dissipation efficiency of the light emitting device package 400d in the present embodiment is better.

However, in other embodiment, the fifth portion 432d and the sixth portion 434d may be magnetic portion and non-magnetic portion, respectively.

Eighth Embodiment

Figure 12:
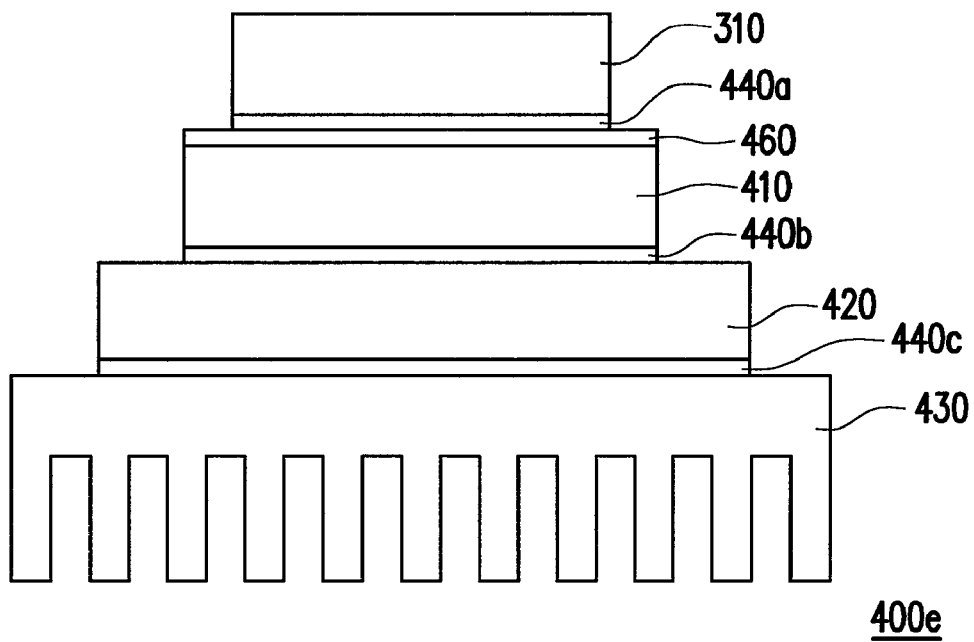
FIG. 12 is a schematic cross-sectional view of a light emitting device package according to an eighth embodiment of the present embodiment.

FIG. 12 is a schematic cross-sectional view of a light emitting device package according to an eighth embodiment of the present embodiment. Referring to FIG. 12, the light emitting device package 400e of the present embodiment is similar to the above light emitting device package 400 in FIG. 7, but the differences between them are as follows. In the light emitting device package 400e, a heat conducting element 460 is disposed between the light emitting device 310 and the first carrier 410 for increasing heat dissipation rate from the light emitting device 310, and the heat conducting element 460 is, for example, a heat conducting layer.

Ninth Embodiment

Figure 13:
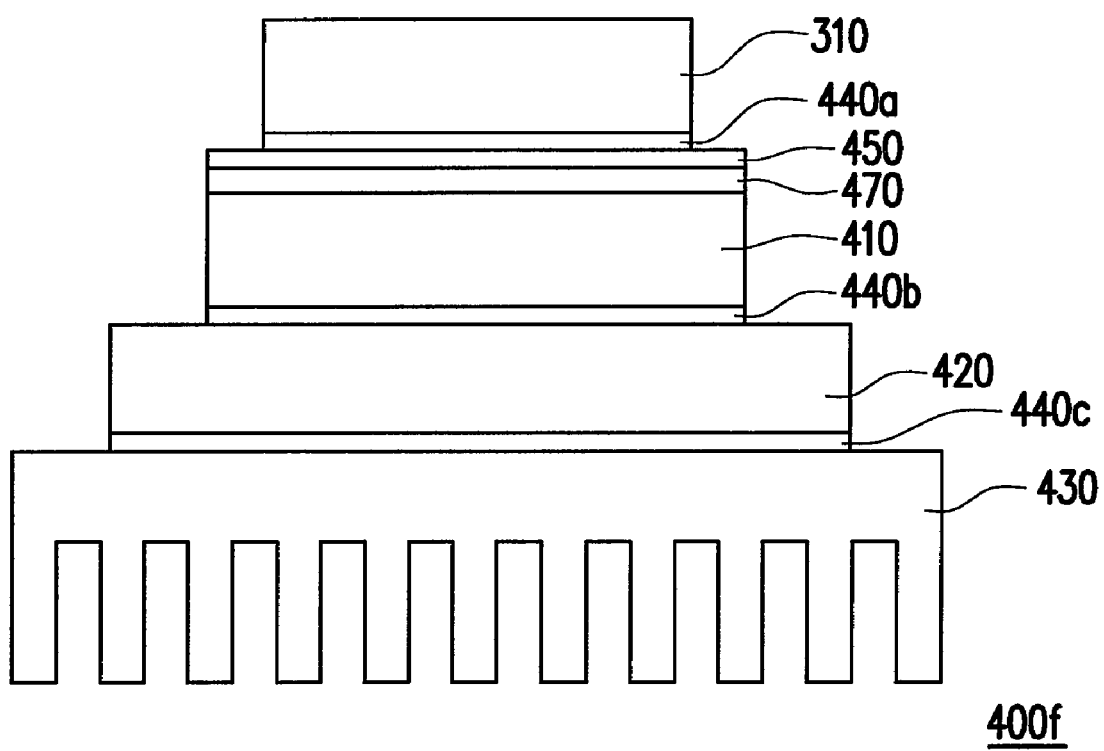
FIG. 13 is a schematic cross-sectional view of a light emitting device package according to a ninth embodiment of the present embodiment.

FIG. 13 is a schematic cross-sectional view of a light emitting device package according to a ninth embodiment of the present embodiment. Referring to FIG. 13, the light emitting device package 400f is similar to the above light emitting device package 400 in FIG. 7, but the differences between them are as follows. In the light emitting device package 400f, a magnetic element 470 is disposed on the first carrier 410, and the light emitting device 310 is disposed on the magnetic element 470. The magnetic element 470 is, for example, a magnetic layer, and forms a magnetic source. All of the first carrier 410, the second carrier 420, and the heat sink 430 may have no magnetism. Alternatively, at least a portion of at least one of the first carrier 410, the second carrier 420, and the heat sink 430 may have magnetism.

Tenth Embodiment

Figure 14:
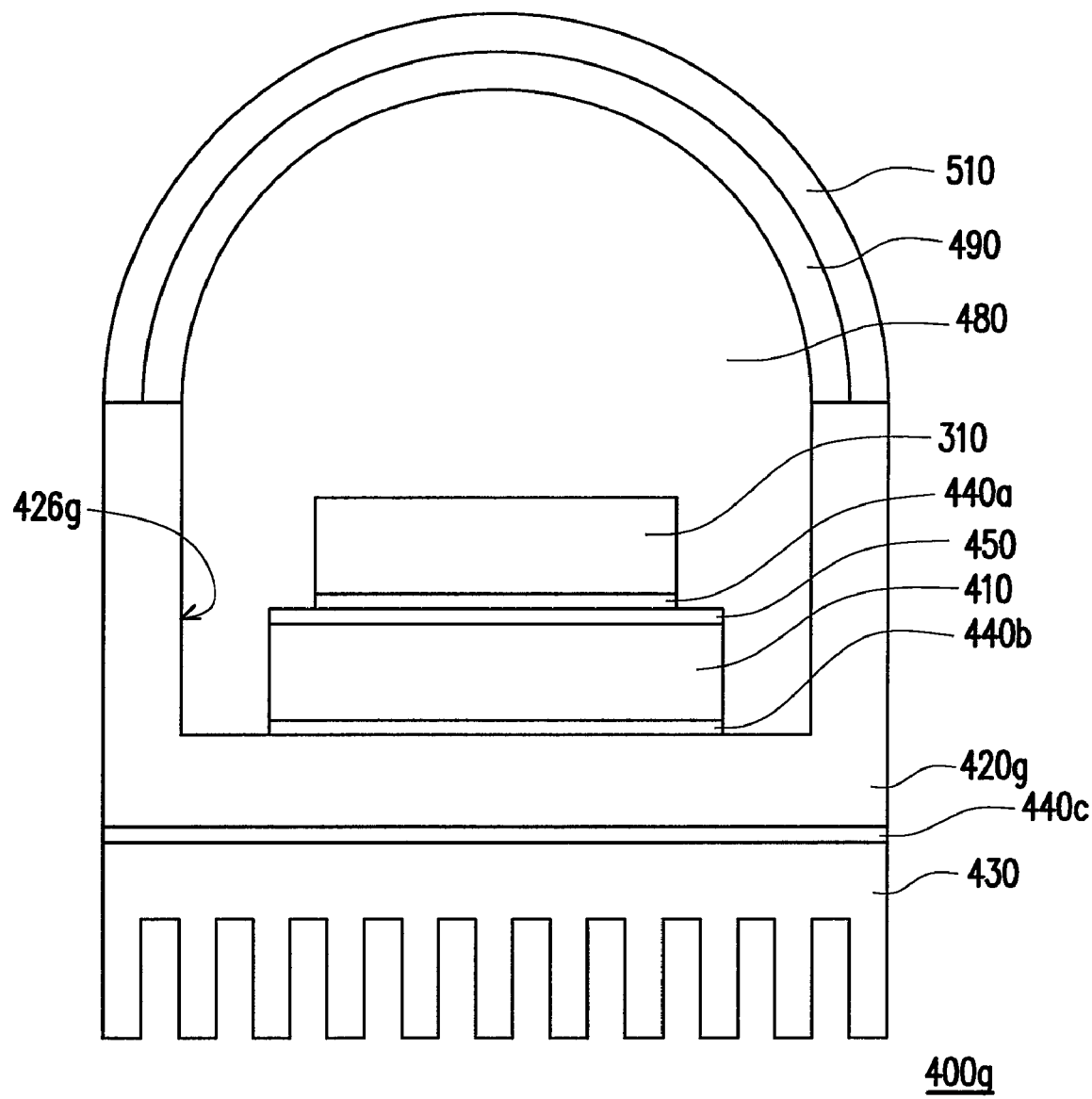
FIG. 14 is a schematic cross-sectional view of a light emitting device package according to a tenth embodiment of the present invention.

FIG. 14 is a schematic cross-sectional view of a light emitting device package 400g according to a tenth embodiment of the present invention. Referring to FIG. 14, the light emitting device package 400g of the present embodiment is similar to the above light emitting device package 400 in FIG. 7, but the differences between them are as follows. The light emitting device package 400g of the present embodiment further includes an encapsulant 480 and a magnetic film 490. The encapsulant 480 wraps the light emitting device 310 and the first carrier 410. In the present embodiment, the material of the encapsulant 480 is, for example, silicone resin or other resin. Moreover, the encapsulant 480 may be doped with or not doped with phosphor. The magnetic film 490 is disposed on the encapsulant 480 for forming the magnetic source. In the present embodiment, the light emitting device package 400g further includes a lens 510 disposed on the magnetic film 490. Additionally, a second carrier 420g has a recess 426g for containing the light emitting device 310 and the first carrier 410 in the present embodiment.

In the present embodiment, all of the first carrier 410, the second carrier 420g, and the heat sink 430 may have no magnetism. However, in other embodiments, at least a portion of at least one of the first carrier 410, the second carrier 420g, and the heat sink 430 may have magnetism.

Eleventh Embodiment

Figure 15:
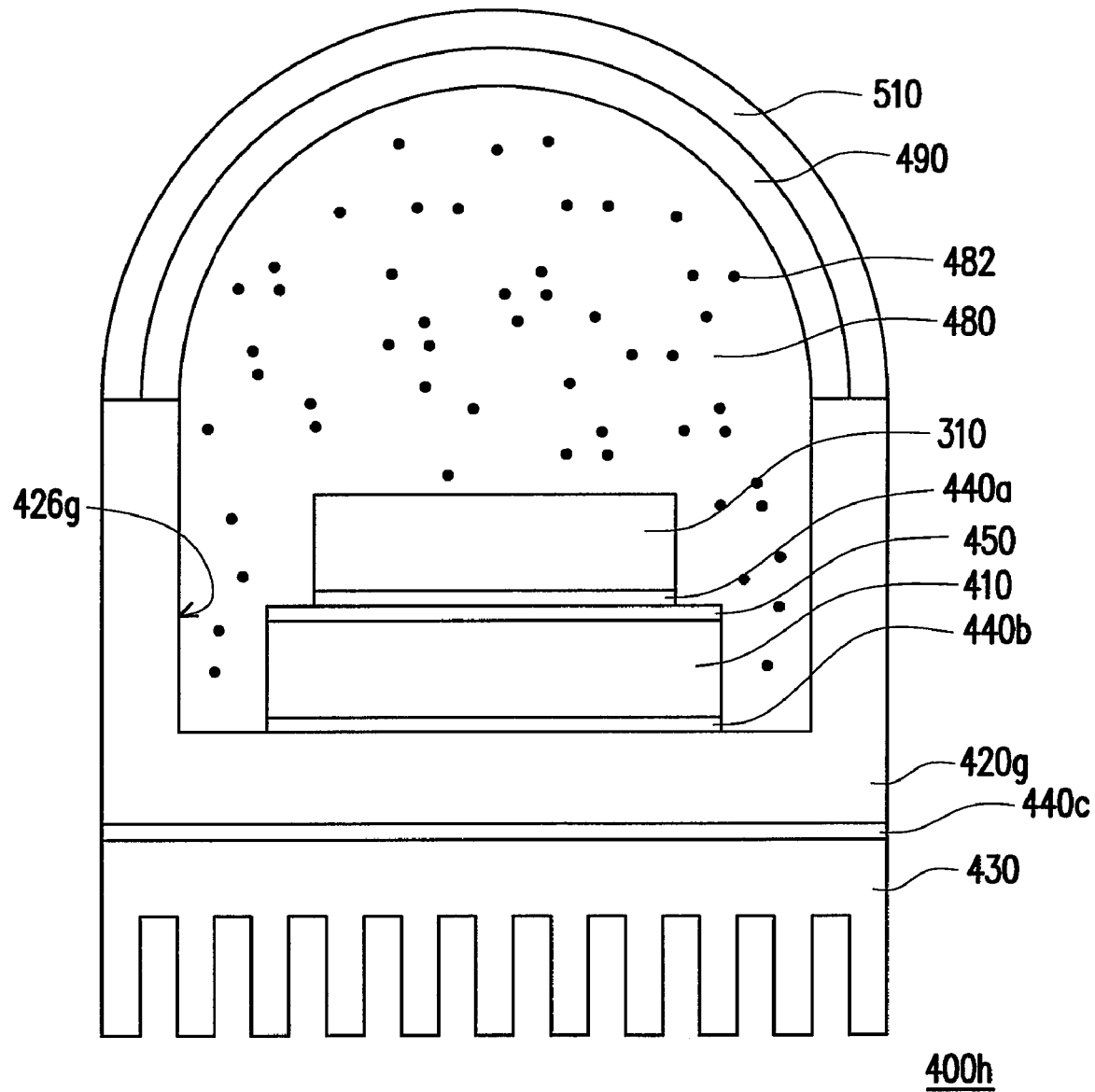
FIG. 15 is a schematic cross-sectional view of a light emitting device package according to an eleventh embodiment of the present invention.

FIG. 15 is a schematic cross-sectional view of a light emitting device package according to an eleventh embodiment of the present invention. Referring to FIG. 15, the light emitting device package 400h of the present embodiment is similar to the above light emitting device package 400g in FIG. 14, but the differences between them are as follows. In the light emitting device package 400h, a plurality of magnetic powders 482 are doped in the encapsulant 480 to form the magnetic source. In other embodiments, the light emitting device package may not include the magnetic film 490, but may include the magnetic powders 482.

Twelfth Embodiment

Figure 16:
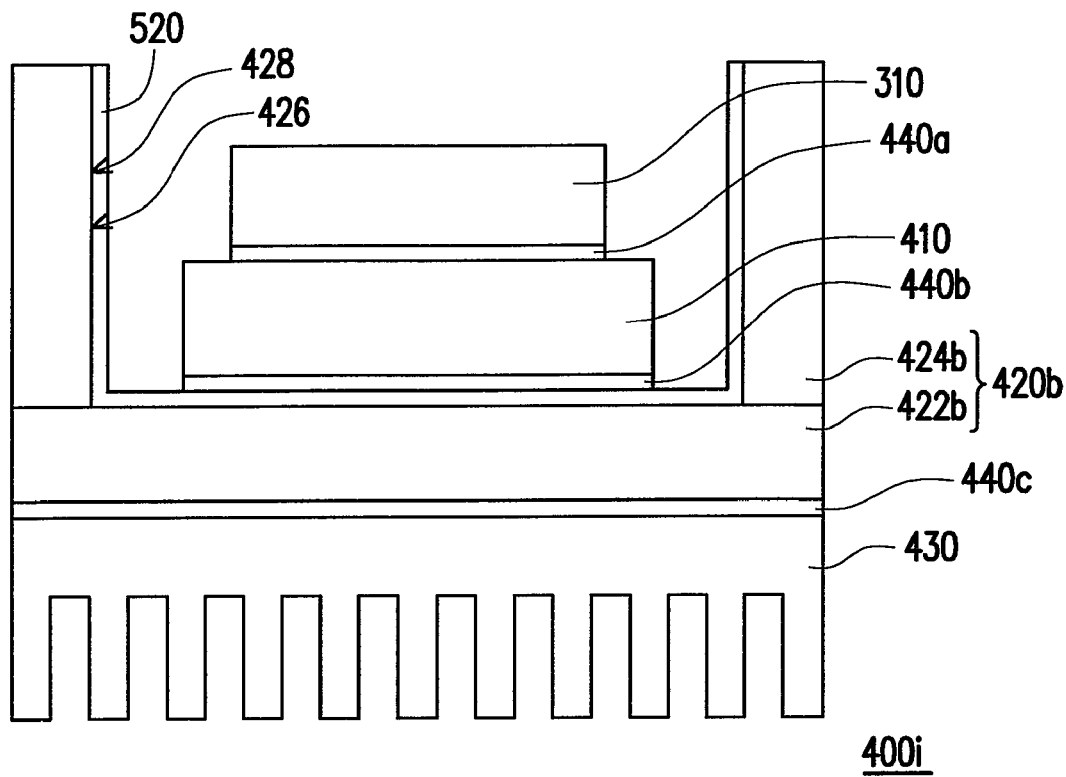
FIG. 16 is a schematic cross-sectional view of a light emitting device package according to a twelfth embodiment of the present invention.

FIG. 16 is a schematic cross-sectional view of a light emitting device package according to a twelfth embodiment of the present invention. Referring to FIG. 16, the light emitting device package 400i of the present embodiment is similar to the above light emitting device package 400b in FIG. 9, but the differences between them are as follows. In the light emitting device package 400i, a reflector 520 is disposed on the bottom portion 422b of the second carrier 420b and the side wall portion 424b of the second carrier 420b, i.e. on the inner surface 428 of the recess 426, for reflecting light from the light emitting device 310, thus increasing the light emitting efficiency of the light emitting device package 400i.

Thirteenth Embodiment

Figure 17:
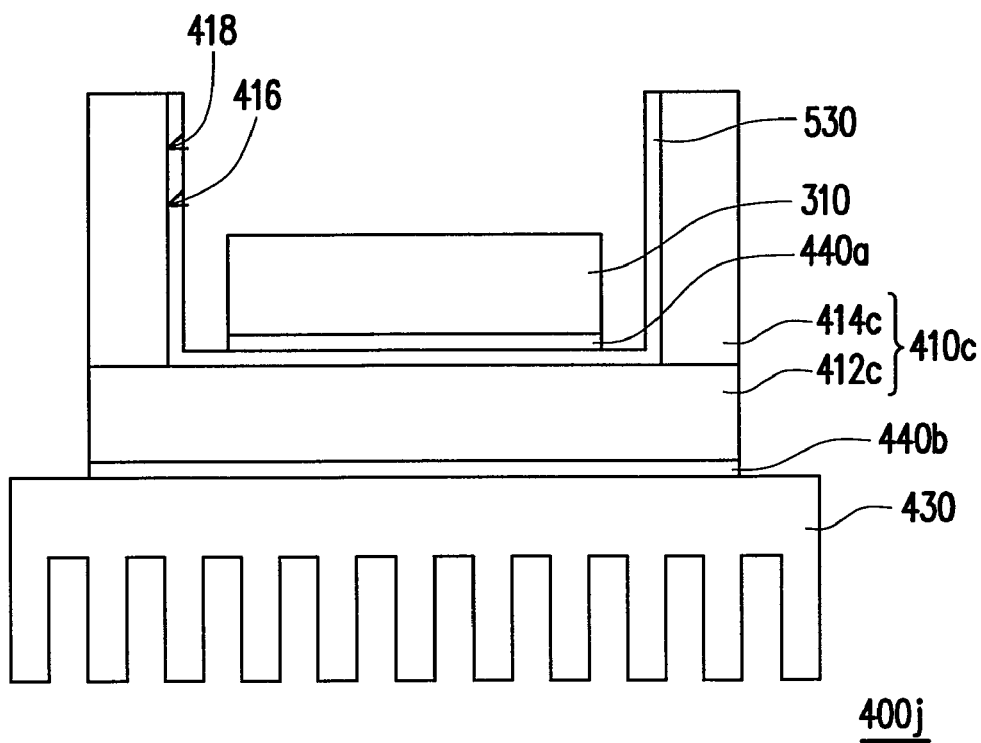
FIG. 17 is a schematic cross-sectional view of a light emitting device package according to a thirteenth embodiment of the present invention.

FIG. 17 is a schematic cross-sectional view of a light emitting device package according to a thirteenth embodiment of the present invention. Referring to FIG. 17, the light emitting device package 400j of the present embodiment is similar to the above light emitting device package 400c in FIG. 10, but the differences between them are as follows. In the light emitting device package 400j, a reflector 530 is disposed on the bottom portion 412c of the first carrier 410c and the side wall portion 414c of the first carrier 410c, i.e. on an inner surface 418 of a recess 416. In the present embodiment, the connection layer 440b bonds the first carrier 410c and the heat sink 430.

Fourteenth Embodiment

Figure 18:
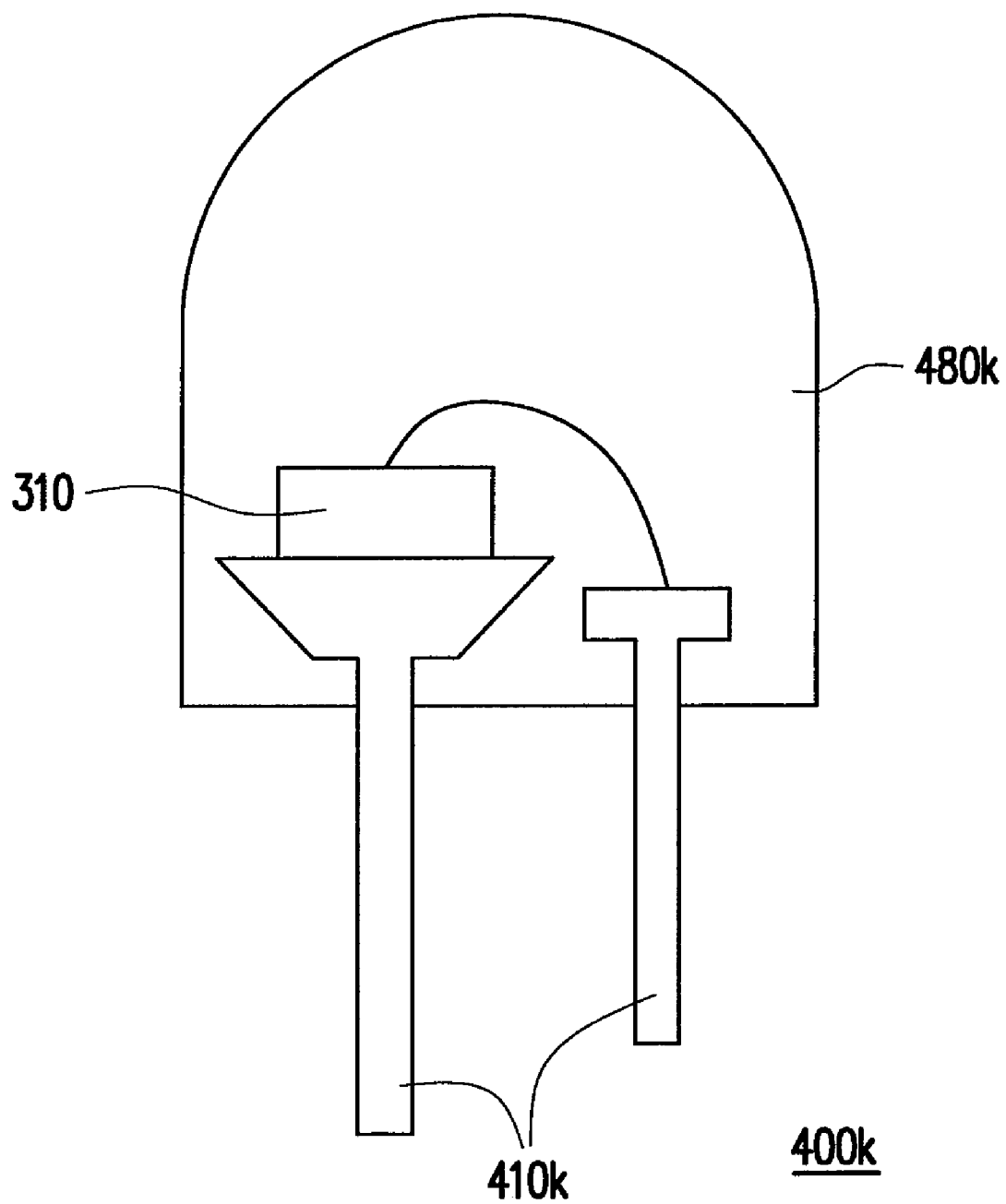
FIG. 18 is a schematic cross-sectional view of a light emitting device package according to a fourteenth embodiment of the present invention.

FIG. 18 is a schematic cross-sectional view of an light emitting device package according to a fourteenth embodiment of the present invention. Referring to FIG. 18, the light emitting device package 400k is partly similar to the above light emitting device package 400g in FIG. 14, but the differences between them are as follows. In the light emitting device package 400k, a first carrier 410k is a lead frame but not a submount as in FIG. 14. In the present embodiment, the first carrier 410k has magnetism. In addition, an encapsulant 480k wraps the light emitting device 310 and a part of the first carrier 410k. In the present embodiment, the material of the 480k is, for example, epoxy resin, silicone resin or other resin.

Fifteenth Embodiment

Figure 19:
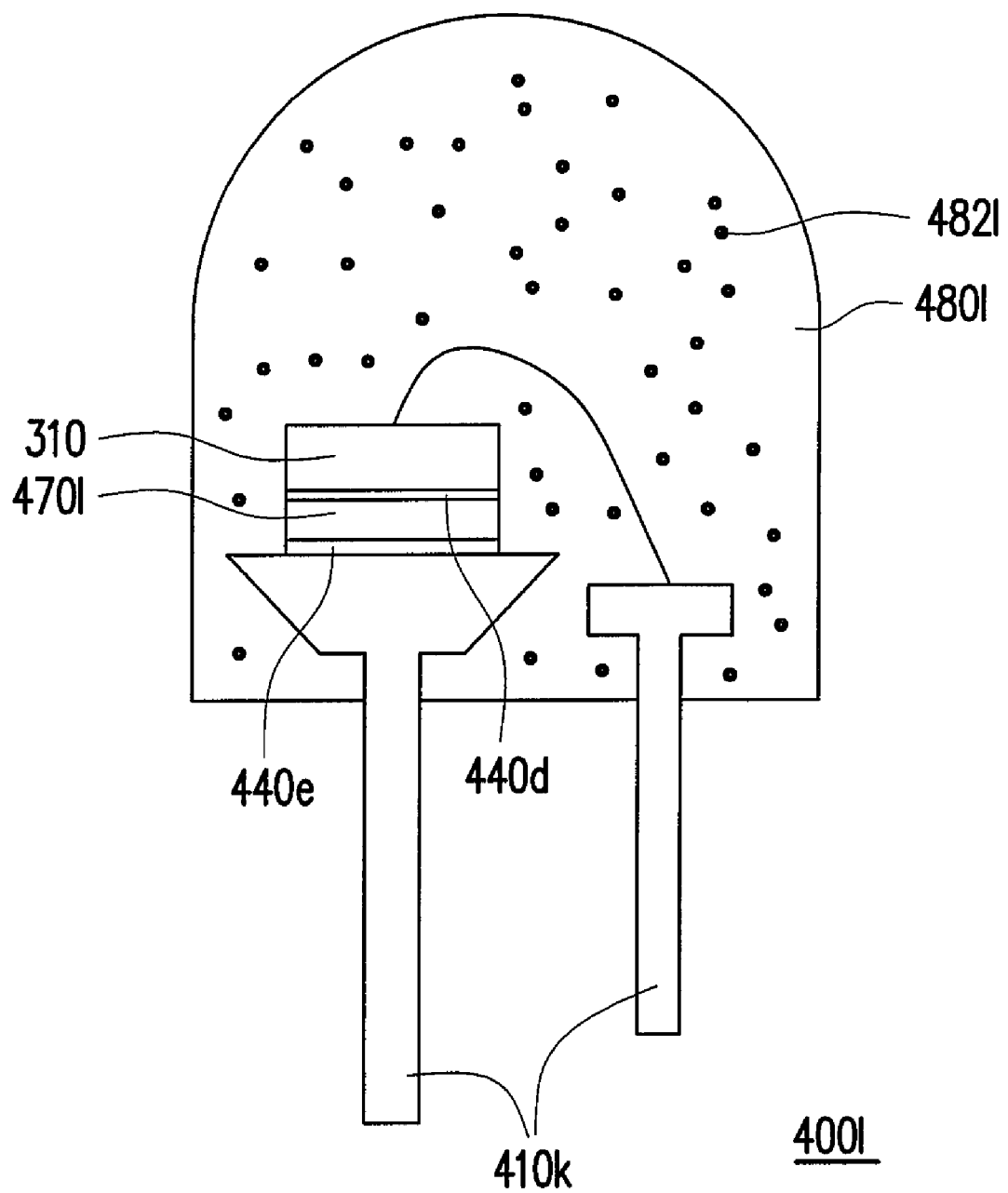
FIG. 19 is a schematic cross-sectional view of a light emitting device package according to a fifteenth embodiment of present invention.

FIG. 19 is a schematic cross-sectional view of an light emitting device package according to a fifteenth embodiment of present invention. Referring to FIG. 19, the light emitting device package 400l is similar to the above light emitting device package 400k in FIG. 18, but the differences between them are as follows. In the light emitting device package 400l, a plurality of magnetic powders 482l are doped in an encapsulant 480l. In addition, a magnetic element 470l is disposed on the first carrier 410k, and the light emitting device 310 is disposed on the magnetic element 470l. In the present embodiment, the magnetic element 470l is, for example, a magnetic layer. In addition, a connection layer 440d may be disposed between the light emitting device 310 and the magnetic element 470l, and another connection layer 440e may be disposed between the magnetic element 470l and the first carrier 410k.

In other embodiments, the light emitting device package may include the magnetic powder 482l but not the magnetic element 470l, and the first carrier 410k has or does not have magnetism. Alternatively, the light emitting device package may include the magnetic element 470l but not the magnetic powder 482l, and the first carrier 410k has or does not have magnetism.

Sixteenth Embodiment

Figure 20:
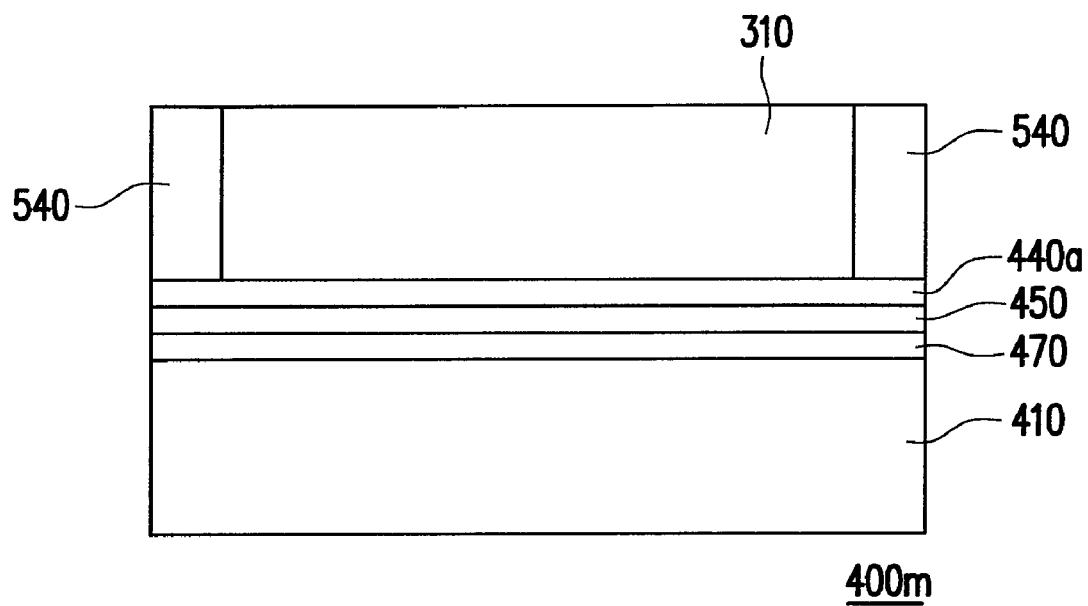
FIG. 20 is a cross-sectional view of a light emitting device package according to a sixteenth embodiment of the present invention.

FIG. 20 is a cross-sectional view of a light emitting device package according to a sixteenth embodiment of the present invention. Referring to FIG. 20, the light emitting device package 400m of the present embodiment is similar to the above light emitting device package 400f in FIG. 13, but the differences therebetween are as follows. The light emitting device package 400m further includes a magnetic ring 540 surrounding the light emitting device 310 for forming the magnetic source. In the present embodiment, the first carrier 410 may or may not have magnetism.

Seventeenth Embodiment

Figure 21:
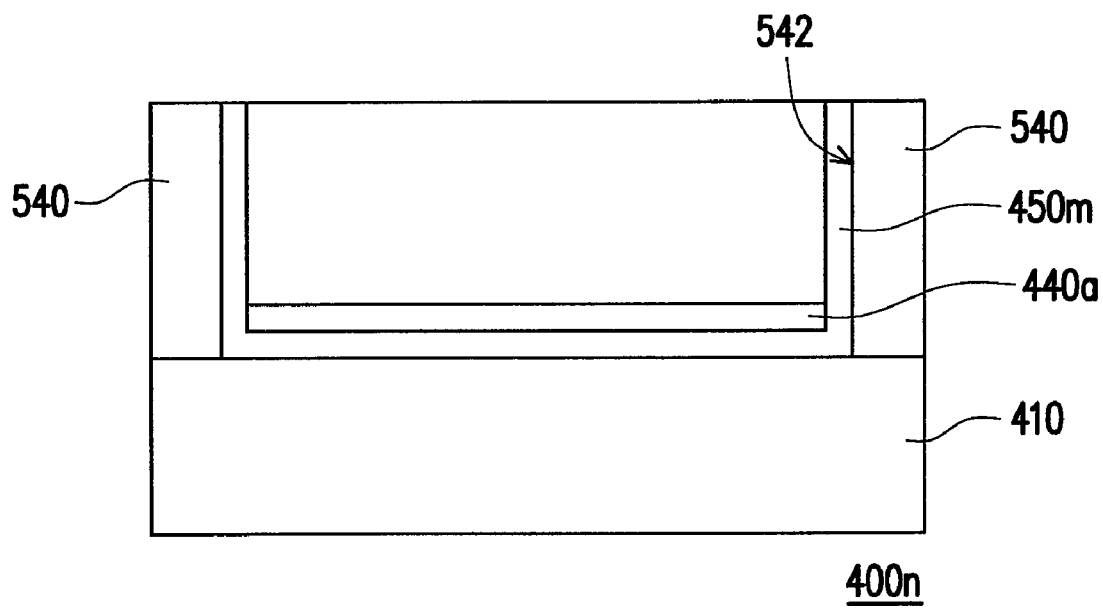
FIG. 21 is a cross-sectional view of a light emitting device package according to a seventeenth embodiment of the present invention.

FIG. 21 is a cross-sectional view of an light emitting device package according to a seventeenth embodiment of the present invention. Referring to FIG. 21, the light emitting device package 400n is similar to the above light emitting device package 400m in FIG. 20, but the differences between them are as follows. In the light emitting device package 400n, a reflector 450m is disposed on both the first carrier 410 and the inner surface 542 of the magnetic ring 540, so as to increase the light emitting efficiency of the light emitting device package 400n.

It should be noted that light emitting device 310 in the above light emitting device packages 400 and 400a~400n may be replaced by the above light emitting device 310' in FIG. 4A to form light emitting device packages in other embodiments.

To sum up, in the light emitting device package according to the embodiments of the present invention, since the magnetic source is disposed beside the light emitting device for applying a magnetic field to the light emitting device, the paths of currents in the light emitting device is changed into better paths by the magnetic field, thus increasing the light emitting efficiency of the light emitting device package.

When the light emitting device package according to the embodiments of the present invention is a vertical type light emitting device package, the magnetic field generates a Lorentz force on the currents in the light emitting device to push the currents along a direction away from the region under the electrode. In this way, the currents are not concentrated under the electrode but spread along the direction away from the region under the electrode, such that more proportion of photons generated in the light emitting layer are not blocked by the electrode, thus increasing the light emitting efficiency of the light emitting device package.

When the light emitting device package according to the embodiments of the present invention is a horizontal type light emitting device package, the magnetic field generates a Lorentz force pushing currents out of the direct paths between the first electrode and the second electrode, such that the currents in the light emitting device are more uniform, which makes photons emitted from the light emitting layer more uniform. In this way, the surface area of the light emitting device may be relatively small even if a larger area for emitting uniform light is needed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting device package comprising:
   a light emitting device; and
   a first carrier, wherein the light emitting device is disposed on the first carrier, and at least a portion of the first carrier forms a magnetic source for applying a magnetic field to the light emitting device.

2. The light emitting device package according to claim 1 further comprising a heat conducting element disposed between the light emitting device and the first carrier.

3. The light emitting device package according to claim 1, wherein the first carrier comprises a bottom portion and a side wall portion disposed on the bottom portion for forming a recess, and the light emitting device is located in the recess.

4. The light emitting device package according to claim 1, wherein the first carrier has a portion forming a magnetic element, and the light emitting device is disposed on the magnetic element.

5. The light emitting device package according to claim 1, wherein the first carrier is a slug.

6. The light emitting device package according to claim 1, wherein the first carrier is a lead frame.

7. The light emitting device package according to claim 6 further comprising an encapsulant wrapping the light emitting device and at least a part of the first carrier.

8. The light emitting device package according to claim 7, wherein at least a portion of the encapsulant has magnetism.

9. The light emitting device package according to claim 7 further comprising a plurality of magnetic powders doped in the encapsulant.

10. A light emitting device package comprising:
    a light emitting device comprising:
       a first doped type layer;
       a second doped type layer; and
       a light emitting layer located between the first doped type layer and the second doped type layer;
    a first carrier, wherein the light emitting device is disposed on the first carrier; and
    a second carrier, wherein the first carrier is disposed on the second carrier, and at least a portion of the second carrier forms a magnetic source for applying a magnetic field to the light emitting device.

11. The light emitting device package according to claim 10, wherein at least a portion of the first carrier has magnetism.

12. The light emitting device package according to claim 10, wherein the second carrier has a recess, and the light emitting device and the first carrier is located in the recess.

13. The light emitting device package according to claim 10, wherein the first carrier is a submount.

14. The light emitting device package according to claim 10, wherein the first carrier is a submount, and the second carrier is a lead frame.

15. A light emitting device package comprising:
    a light emitting device comprising:
       a first doped type layer;
       a second doped type layer; and
       a light emitting layer located between the first doped type layer and the second doped type layer;
    a first carrier, wherein the light emitting device is disposed on the first carrier;
    a second carrier, wherein the first carrier is disposed on the second carrier; and
    a heat sink, wherein the second carrier is disposed on the heat sink, and at least a portion of the heat sink forms a magnetic source for applying a magnetic field to the light emitting device.

16. The light emitting device package according to claim 15, wherein at least a portion of at least one of the first carrier and the second carrier has magnetism.

17. The light emitting device package according to claim 16, wherein the first carrier is a submount, and at least a portion of the first carrier has magnetism.

18. The light emitting device package according to claim 15, wherein the heat sink comprises:
    a magnetic portion; and
    a non-magnetic portion having a recess for containing the magnetic portion, wherein the second carrier is disposed on both the magnetic portion and the non-magnetic portion and crosses a boundary between the magnetic portion and the non-magnetic portion, and the heat conductivity of the non-magnetic portion is greater than the heat conductivity of the magnetic portion.

19. A light emitting device package comprising:
    a light emitting device comprising:
       a first doped type layer;
       a second doped type layer; and
       a light emitting layer located between the first doped type layer and the second doped type layer;
    a carrier, wherein the light emitting device is disposed on the carrier;
    an encapsulant wrapping the light emitting device and at least a part of the carrier; and
    a plurality of magnetic powders doped in the encapsulant, wherein the magnetic powders form a magnetic source for applying a magnetic field to the light emitting device.

20. The light emitting device package according to claim 19, wherein at least a portion of the carrier has magnetism.

21. A light emitting device package comprising:
    a light emitting device comprising:
       a first doped type layer;
       a second doped type layer; and
       a light emitting layer located between the first doped type layer and the second doped type layer;

a carrier, wherein the light emitting device is disposed on the carrier;

an encapsulant wrapping the light emitting device and at least a part of the carrier; and a magnetic film disposed on the encapsulant for forming a magnetic source for applying a magnetic field to the light emitting device.

22. The light emitting device package according to claim 21, wherein at least a portion of at least one of the carrier and the encapsulant has magnetism.

23. The light emitting device package according to claim 21 further comprising a lens disposed on the magnetic film.

24. A light emitting device package comprising:

an light emitting device;

a first carrier, wherein the light emitting device is disposed on the first carrier, the first carrier comprises a bottom portion and a side wall portion disposed on the bottom portion for forming a recess, and the light emitting device is located in the recess; and an encapsulant wrapping the light emitting device and at least a part of the first carrier, wherein at least a portion of the encapsulant forms a magnetic source for applying a magnetic field to the light emitting device.

25. The light emitting device package according to claim 24 further comprising a second carrier disposed between the light emitting device and the first carrier, wherein the second carrier is a submount.

26. The light emitting device package according to claim 24, wherein the first carrier is a slug.

27. The light emitting device package according to claim 24 further comprising a plurality of magnetic powders doped in the encapsulant.

28. A light emitting device package comprising:

a light emitting device;

a first carrier, wherein the light emitting device is disposed on the first carrier; and a heat sink, wherein the first carrier is disposed on the heat sink, and at least a portion of the heat sink forms a magnetic source for applying a magnetic field to the light emitting device.

* * * * *